(12) United States Patent
Yamada et al.

(10) Patent No.: US 7,108,400 B2
(45) Date of Patent: Sep. 19, 2006

(54) LIGHT SOURCE UNIT AND PROJECTOR

(75) Inventors: Shuhei Yamada, Suwa (JP); Takeshi Seto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 72 days.

(21) Appl. No.: 10/935,318

(22) Filed: Sep. 8, 2004

(65) Prior Publication Data

US 2005/0094397 A1    May 5, 2005

(30) Foreign Application Priority Data

Sep. 4, 2003   (JP) .............................. 2003-312839

(51) Int. Cl.
*F21V 29/00*   (2006.01)
(52) U.S. Cl. .................. 362/294; 362/373; 257/714
(58) Field of Classification Search .......... 257/79–103, 257/714; 353/54; 361/698, 699; 362/273, 362/294, 318, 373
See application file for complete search history.

(56) References Cited

U.S. PATENT DOCUMENTS

| | | | | |
|---|---|---|---|---|
| 1,895,887 A | * | 1/1933 | Lorenz ........................ 362/294 |
| 2,943,534 A | * | 7/1960 | Gerhard ....................... 352/146 |
| 5,497,573 A | * | 3/1996 | Stadjuhar et al. .............. 40/564 |
| 5,857,768 A | * | 1/1999 | Ziegler et al. ............... 362/294 |
| 5,890,794 A | * | 4/1999 | Abtahi et al. ................ 362/294 |
| 6,815,724 B1 | * | 11/2004 | Dry .............................. 257/88 |
| 6,964,501 B1 | * | 11/2005 | Ryan ........................... 362/294 |
| 2003/0035290 A1 | * | 2/2003 | Bornhorst .................... 362/318 |

FOREIGN PATENT DOCUMENTS

| JP | U 02-140173 | 11/1990 |
|---|---|---|
| JP | A 07-045761 | 2/1995 |
| JP | A 08-116138 | 5/1996 |
| JP | A 2001-36148 | 9/2001 |
| JP | A 2002-115981 | 4/2002 |

* cited by examiner

*Primary Examiner*—Thomas M. Sember
*Assistant Examiner*—Adam C. Rehm
(74) *Attorney, Agent, or Firm*—Oliff & Berridge, PLC

(57) ABSTRACT

A light source unit is provided that is adapted for efficient cooling and for illumination of high luminance, and a projector including the same. A light source unit including a solid-state light source and a lens further includes a first fluid flowing in the vicinity of the solid-state light source thereby absorbing heat generated from the solid-state light source, and a second fluid flowing in the vicinity of the first fluid thereby absorbing the heat contained in the first fluid.

28 Claims, 5 Drawing Sheets

LIGHT SOURCE UNIT AND PROJECTOR

CROSS-REFERENCE TO RELATED APPLICATION

This application claims priority from Japanese Patent Application No. 2003-312839, filed Sep. 10, 2003, the entire disclosure of which is hereby incorporated by reference.

BACKGROUND OF THE INVENTION

1. Field of Invention

Exemplary aspects of the present invention relate to a light source unit and a projector.

2. Description of Related Art

In related art projectors (projection display apparatuses), halogen lamps, as an older type, or ultra-high pressure mercury lamps (UHP lamps), as a modern type, have been widely used as a light source. The UHP lamps feature high luminance and high luminous efficiencies. The light source employing the UHP lamp, which is a discharge lamp, requires a high-voltage source circuit and has a large size and a heavy weight. Hence, such a light source constitutes an obstruction to the reduction of size and weight of the projector. The UHP lamp has not yet achieved a sufficient length of service life although the service life thereof is longer than that of the halogen lamp. Furthermore, it is almost impossible to control the light source employing the UHP lamp (high-speed turn-on, turn-off, or modulation). In addition, the UHP lamp requires several minutes for activation.

An LED device is being considered as a light source. The LED has an ultra-miniature and ultra-light structure as well as a long service life. Furthermore, the LED allows for free control of turn-on, turn-off and the amount of illumination light by way of the control of a drive current. Unfortunately, however, it is difficult for the state of the art to attain a sufficient luminance from a projector employing the LED as the light source. This is because the LED has a luminous efficiency of about ½ to ⅓ of that of the UHP lamp so that a small amount of light is attained from the LED operating on an upper limit of the rated current. Technological innovations have steadily been enhancing the above efficiency so that the LED may achieve an efficiency comparable to that of the current UHP lamp in the years ahead. At least in the foreseeable future, however, the status quo for the projectors with the LED light source, which are to be brought to the commercial stage, will remain unchanged. There is a related art method where LEDs are arranged in an array in order to increase the amount of illumination light. However, this method does not provide much notable effect because a light emitting point is increased in size so that the efficiency of the illumination light of an optical system is lowered.

As the last viable approach, it may be contemplated to increase the amount of illumination light from the LED. However, the amount of illumination light is limited by the rated current for the LED, as described above. The maximum amount of illumination light from the LED is automatically decided by the ratings and the luminous efficiency thereof. Considering that the rated current for the LED primarily depends upon the amount of generated heat, a cooling technique has been proposed to address the heat generation, the technique wherein a fluid having high heat conductivity is filled in a related art LED package. See, for example, JP-A-2001-36148.

SUMMARY OF THE INVENTION

Where the above technique is adopted, however, it is difficult to obtain an adequate effect to dissipate the heat. Therefore, a fear of thermal damage on the chip inhibits the increase of the rated current. Consequently, the maximum light output is limited.

Exemplary aspects of the invention has been developed to address the above and/or other problems. Exemplary aspects of the invention provides a light source unit capable of providing an efficient cooling and high-luminance illumination, and a projector including the same.

For achieving the above exemplary aspects of the invention have adopted the following arrangement.

A light source unit of an exemplary aspect of the invention includes a solid-state light source and a lens, the unit including a first fluid flowing in the vicinity of the solid-state light source thereby absorbing heat generated from the solid-state light source, and a second fluid flowing in the vicinity of the first fluid thereby absorbing the heat contained in the first fluid.

The solid-state light source is defined to mean an LED chip, semiconductor laser or the like.

According to an exemplary aspect of the invention, the light source unit includes the first fluid flowing in the vicinity of the solid-state light source, such that the first fluid may absorb the heat generated from the solid-state light source. This leads to the increase in the heat content of the first fluid. However, the light source unit may include the second fluid flowing in the vicinity of the first fluid, such that the first fluid may be cooled.

The first fluid thus cooled is able to absorb the heat from the solid-state light source repeatedly and continuously, while the heat contained in the first fluid is discharged out of the light source unit by way of the second fluid. That is, the solid-state light source is cooled by bringing both the first and second fluids into flowing movements.

The first fluid in flowing movement provides a more active cooling of the solid-state light source as compared with a case where the first fluid is simply allowed to dwell in the vicinity of the solid-state light source. Hence, an increased cooling efficiency may be achieved.

According to the aforesaid light source unit, the first fluid may preferably flow through space between the solid-state light source and the lens.

It is generally known that an illuminant portion of the solid-state light source, in particular, is significantly increased in temperature because the amount of generated heat is particularly great in the vicinity of the illuminant portion. In most cases, the solid-state light source is disposed in a manner that the illuminant portion thereof opposes the lens in order to allow the lens to efficiently extract an illumination light from the solid-state light source. Hence, the first fluid is moved through space between the solid-state light source and the lens, thereby efficiently absorbing the heat released from, for example, a lens-side of the solid-state light source or the illuminant portion thereof.

According to the aforesaid light source unit, the first fluid may flow on the opposite side of the solid-state light source from a side thereof opposed to the lens.

Such an arrangement permits the first fluid to absorb the generated heat directly from a portion of the solid-state light source, at which the first fluid does not interfere with the illumination light.

According to the light source unit of an exemplary aspect of the invention, the first fluid may flow over the peripheries of the solid-state light source.

Such an arrangement permits the first fluid to flow around the whole body of the solid-state light source instead of flowing by only the illuminant portion of the solid-state light source. Hence, the overall surface of the solid-state light source is cooled, which leads to the reduction or prevention of, for instance, local heating.

According to the light source unit of an exemplary aspect of the invention, the first fluid may preferably comprise a transparent material.

Such a material permits the illumination light from the solid-state light source to pass through the first fluid and to enter the lens and preventing the illumination light from being reduced in quantity.

It is particularly effective to employ such a transparent material as the first fluid flowing through space between the lens and the solid-state light source.

According to the light source unit of an exemplary aspect of the invention, the first fluid may have the same refractive index as that of the lens.

Such an arrangement reduces or prevents the illumination light from the solid-state light source from being scattered during passage through the first fluid. Thus, the illumination light may be emitted to the lens.

It is particularly effective to employ such a transparent material as the first fluid flowing through space between the lens and the solid-state light source.

According to the light source unit of an exemplary aspect of the invention, the type of the first fluid may be selected according to the wavelength of the illumination light from the solid-state light source.

It is noted here that "to select the material according to the wavelength of the illumination light" means to select the type of the first fluid according to the color wavelength (color wavelength band) of the light such as represented by a red light (R), a green light (G) or a blue light (B).

Thus, the fluid material having particular properties dependent upon the color wavelengths of light may be selected as the first fluid. For instance, a fluid material more transparent to R or G than B or having a high transmission to a specific color wavelength may be selected as the first fluid, so that the solid-state light source is allowed to emit light without being lowered in illumination performance with respect to a specific color wavelength.

According to the light source unit of an exemplary aspect of the invention, the second fluid may preferably flow around the solid-state light source.

Such an arrangement provides an increased area for heat exchange between the first fluid having absorbed the heat generated from the solid-state light source and the second fluid. As a result, an increased cooling efficiency may be achieved.

According to the light source unit of an exemplary aspect of the invention, a pumping element for bringing the first fluid into flowing movement may be provided.

Such an arrangement permits the first fluid to efficiently absorb the heat from the solid-state light source because the first fluid is brought into the flowing movement by the pumping element. That is, the cooling efficiency may be increased even further.

According to the light source unit of an exemplary aspect of the invention, the pumping element may reciprocally move the first fluid.

Such an arrangement provides the following effect. The first fluid is moved in a predetermined direction, for example, thereby cooling a portion of the solid-state light source, by which the first fluid passes. Subsequently, the first fluid is moved in the opposite direction to the predetermined direction so that the returned first fluid may be cooled by the second fluid. Because of the reciprocal flowing movement, the first fluid is capable of carrying out both the heat absorption and the heat exchange with the second fluid in a continuous and effective manner.

According to the light source unit of an exemplary aspect of the invention, the pumping element may be disposed at the opposite ends of a flow passage of the first fluid.

Such an arrangement achieves a higher output pressure than a case where a single pumping element is provided. Thus, the first fluid may be retained in the flowing movement and prevented from dwelling. In a case where a highly viscous fluid is employed as the first fluid, for example, this arrangement is particularly effective because the high output pressure is required for bringing the first fluid into a favorable flowing movement.

According to the light source unit of an exemplary aspect of the invention, the pumping element may circulate the first fluid.

Such an arrangement retains the first fluid in a constantly circulating movement near the illuminant portion of the solid-state light source and hence, the heat generated from the solid-state light source is continuously transferred to the first fluid. This permits the first fluid to retain a stable cooling power for the solid-state light source. In this case, a plural number of pumping elements may be provided. An alternative arrangement including a check valve may be adopted for limiting the flowing movement of the fluid to a predetermined direction.

According to the light source unit of an exemplary aspect of the invention, the pumping element may be a piezoelectric device.

The piezoelectric device has an output pressure higher than that of a centrifugal pump by an order of magnitude or more and hence, is capable of bringing the first fluid into flowing movement with the high output pressure.

A projector according to an exemplary aspect of the invention includes the aforementioned light source unit, and an optical modulator on which the light emitted from the light source unit becomes incident.

Such a projector includes the light source unit achieving the increased cooling efficiency and hence, permits the increase of input power to the solid-state light source. This results in an increased amount of illumination light from the solid-state light source. Accordingly, a compact light source may be employed to emit the illumination light of an extremely high luminance. Because of an optimum source etendu, the emitted illumination light is effectively captured by the optical modulator which, in turn, projects a modulated light on a screen to form a bright image.

That is, the compact projector featuring high luminance may be provided.

DETAILED DESCRIPTION OF EXEMPLARY EMBODIMENTS

Figure 1:
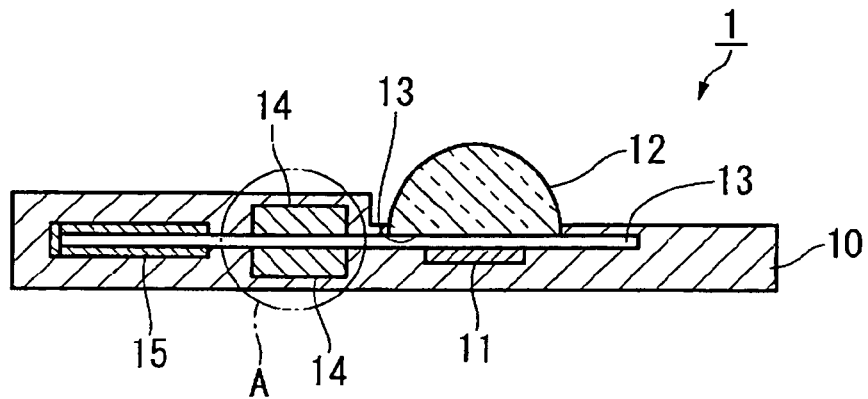
FIG. 1 is a schematic showing a light source unit according to a first exemplary embodiment of the invention.

The exemplary embodiments of the invention will hereinbelow be described with reference to the accompanying drawings.

In the drawings referred to by the following description, individual members are depicted on various scales to permit the recognition thereof.

First Exemplary Embodiment of Light Source Unit

Figure 2:
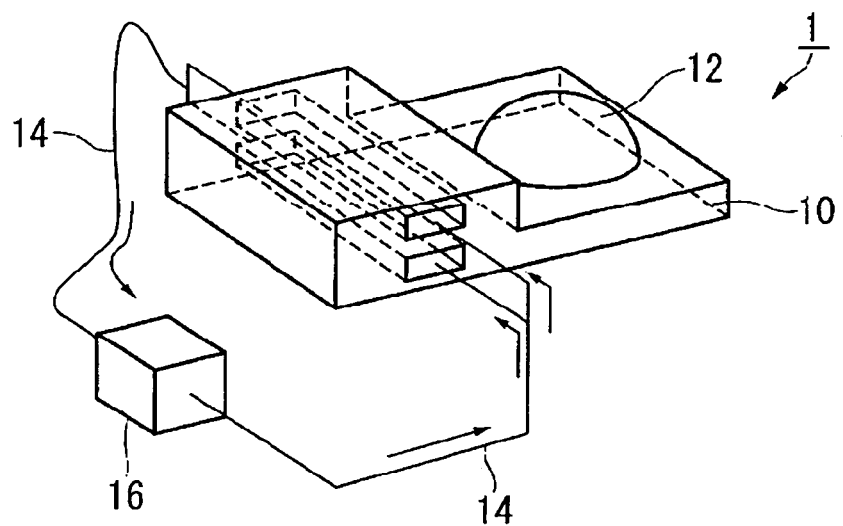
FIG. 2 is a schematic for illustrating a second coolant flow passage of the light source unit of FIG. 1.

FIG. 1 is schematic showing a light source unit according to a first exemplary embodiment of the invention. FIG. 2 is a schematic for illustrating a second coolant flow passage.

As shown in FIG. 1, a light source unit 1 according to the exemplary embodiment includes: a mounting substrate 10; an LED chip (solid-state light source) 11; a lens 12; a first coolant flow passage 13; a second coolant flow passage 14; and a piezoelectric device (pumping device) 15.

As shown in FIG. 2, the light source unit 1 is further provided with a cooling element 16, which is disposed externally of the light source unit and connected thereto via the second coolant flow passage 14.

The mounting substrate 10 is a member constituting a base of the light source unit 1. The mounting substrate hermetically seals the whole body of the LED chip 11 by packaging. A lead frame (not shown) is led out of the package to supply an electric power to the LED chip 11, such that the LED chip may be energized by an external source. A material to form such a mounting substrate 10 includes thermosetting resins such as epoxy.

The LED chip 11 essentially includes a p-type semiconductor and an n-type semiconductor connected with each other. The LED chip further includes a pair of electrodes formed from a conductive material, such as Al, and a package formed from a transparent material, such as a resin. One end face of the LED chip 11 is in face-to-face connection with an upper surface of one of the pair of electrodes, whereas the other end face of the LED chip is connected to an upper surface of the other one of the electrode pair by wire bonding. While the exemplary embodiment employs the LED chip 11 as the solid-state light source, any other light source, such as a semiconductor laser may be used.

The LED chip 11 is discussed in more details. The LED chip 11 is a so-called diode which emits light when a current flows through a junction thereof. An LED of a simple homo junction configuration includes a p-type semiconductor and an n-type semiconductor which are crystallized from the same material. When the LED of the homo junction configuration is forward biased, electrons in the n-type semiconductor are transferred into the p-type semiconductor, thus migrating from a high-energy conduction band into a low-valence band to recombine with positive holes. An energy released in this process is emitted as light, so that the LED illuminates. It is noted that the color of an illumination light depends upon the energy difference (band gap) between the conduction band and the valence band whereas the band gap depends upon the semiconductor material to be used. In a case where AlGaAs or the like is used, the diode emits a red light. Where GaP or the like is used, the diode emits a green light. Where InGaN or the like is used, the diode emits a blue light. Thus, the LED serves as a solid-state light source of a single color.

The LED of the homo junction configuration is low in the luminous efficiency and hence, the LED chip 11 may employ an LED of a double-hetero junction configuration or of a quantum well junction configuration. The LED of the double-hetero junction configuration is constructed such that an active layer of a small band gap is sandwiched between the p-type semiconductor and the n-type semiconductor. When the LED of the double-hetero junction configuration is forward biased, the active layer is increased in density as trapping the electrons and the positive holes therein. This provides for an efficient recombination between the electrons and the positive holes so that the LED can achieve a high luminous efficiency. The LED of the quantum well junction configuration is constructed such that a plurality of thin semiconductor layers of a thickness of about electron wavelength (about 10 nm) are interposed between the p-type semiconductor and the n-type semiconductor. When the LED of the quantum well junction configuration is forward biased, the electrons and positive holes of a predetermined energy level may exclusively be concentrated on a junction region. This provides for an efficient recombination between the electrons and positive holes, so that the LED may achieve a high luminous efficiency. In addition, the emitted light has such a small wavelength width that the illumination light nearly has a single color. The LED having such a high luminous efficiency may be employed as the solid-state light source for a projection display apparatus, such as a projector, thereby increasing the luminance of images and reducing power consumption.

The lens 12 is an element to extract the light emitted from the LED chip 11. The lens may be formed from any transparent material, such as glass or resin materials.

Next, a description is provided for the first coolant flow passage 13, second coolant flow passage 14 and piezoelectric device (pumping device) 15 which constitute the features of an exemplary aspect of the invention.

The first coolant flow passage 13 is extended between the LED chip 11 and the lens 12 and along a direction in which the mounting substrate 10 extends, as shown in FIG. 1. The first coolant flow passage is provided with the piezoelectric device 15 at one end thereof. At a space between the lens 12 and the piezoelectric device, the second coolant flow passage 14 is extended above and below the first coolant flow passage in a manner to cross the first coolant flow passage.

In the first coolant flow passage 13 thus arranged, a first coolant equivalent to a first fluid of an exemplary aspect of the invention is reciprocally moved in conjunction with the operation of the piezoelectric device 15. The first coolant is brought into flowing movement thereby carrying out heat exchange with a second coolant flowing through the second coolant flow passage 14 at an intersection A between the first coolant flow passage 13 and the second coolant flow passage 14. It is noted here that the second coolant is equivalent to a second fluid of an exemplary aspect of the invention.

As shown in FIG. 2, the light source unit 1 is further provided with the cooling element 16 which is connected thereto via the second coolant flow passage 14 extended externally of the unit. Therefore, the second coolant raised in temperature by the heat exchange at the intersection A is cooled by the cooling element 16 and then is circulated through the second coolant flow passage 14.

Specifically, a transparent material, such as a matching oil of silicone may be used as the first coolant. The transparent material may have the same refractive index as that of the package of the LED chip 11 or of the lens 12. Alternatively, a transparent material having a high viscosity, such as a silicone gel may also be used. Examples of the fluid material applicable to exemplary aspects of the invention include organic heat transfer media commonly used in the art, such as the aforementioned silicones, biphenyl-diphenyl ethers, alkylbenzenes, alkyl biphenyls, triaryldimethanes, alkylnaphthalenes, terphenyl hydrides, and diarylalkanes. Furthermore, fluorine-based fluids are also applicable to the exemplary aspects of invention. Any suitable material may be selected from the above group in view of the application and required performance of the light source unit as well as the environmental protection and the like.

Water may be used as the second coolant. Although the second coolant may be any other material than water, water is particularly advantageous in terms of high degree of convenience and high cooling power. In a case where the second coolant flow passage 14 is long as shown in FIG. 2, there is a fear that the cooling efficiency is lowered by piping resistance. Hence, it is preferred to use a fluid of low viscosity in order to reduce the piping resistance. That is, water is favorable as such a fluid of low viscosity.

The piezoelectric device 15 may be used as the pumping device for the following reasons. The piezoelectric device 15 has an output pressure higher than that of a centrifugal pump by an order of magnitude or more. Furthermore, the piezoelectric device is adapted for quite a compact incorporation into the mounting substrate 10. Thus, the piezoelectric device offers an advantage of producing a favorable flow of a highly viscous fluid which may be used as the first coolant. The piezoelectric device 15 is characterized by being capable of repeatedly alternating between a position where a drive plate thereof is flexed and a position where the drive plate thereof is un-flexed, as operatively associated with turn-ON or turn-OFF of supply voltage. Hence, the piezoelectric device 15 may be provided at the end of the first coolant flow passage, thereby causing the first coolant to reciprocally move in the first coolant flow passage in conjunction with the flexed state of the drive plate and the un-flexed state thereof. The piezoelectric device 15 may be driven at each lapse of a predetermined time period or otherwise, driven according to a sensing result given by a temperature sensor disposed at the mounting substrate. The use of such a piezoelectric device also provides an advantage of obviating the loss of extracted illumination light, the loss caused by the first coolant in the flowing movement.

The pumping device is not limited to the piezoelectric device 15 and any other compact driver, such as an electrostatic device is also usable.

Next, description is made of the operations of the light source unit 1 thus arranged.

First, an electric power to cause the LED chip 11 to illuminate is supplied from a source external of the mounting substrate 10, so that the illumination light from an illuminant portion of the LED chip 11 is extracted via the lens 12. In association with the emission of light from the LED chip 11, the LED chip 11 generates heat so as to be raised in temperature. By driving the piezoelectric device 15 in this state, the first coolant in the first coolant flow passage 13 is reciprocally moved in the direction in which the mounting substrate 10 of FIG. 1 is extended. Specifically, the piezoelectric device 15 is driven to move the first coolant over the LED chip 11 where the first coolant absorbs the heat generated by the LED chip 11. As the piezoelectric device 15 is further driven, the first coolant is drawn back to the intersection A with the second coolant flow passage where the heat exchange is carried out between the first coolant and the second coolant. The heat contained in the first coolant is absorbed by the second coolant. As the piezoelectric device 15 is still further driven, the first coolant is moved over the LED chip 11 so as to absorb the heat generated by the LED chip 11 in the aforementioned manner. The second coolant having absorbed the heat contained in the first coolant is circulated through the second coolant flow passage so as to be cooled by the cooling element 16. Subsequently, the second coolant thus cooled is returned to the intersection A again.

Both the first coolant and the second coolant are held in flowing movements in this manner, so that the light source unit 1 may emit light as being cooled.

As described above, the light source unit 1 is adapted to cool the LED chip 11 efficiently by bringing both the first coolant and the second coolant into the flowing movements. The first coolant in the flowing movement can accomplish a more active cooling of the solid-state light source as compared with a case where the first coolant is simply allowed to dwell in the vicinity of the solid-state light source. Therefore, the light source unit can achieve an increased cooling efficiency.

Since the arrangement is made such that the first coolant flows through space between the lens 12 and the LED chip 11, the first coolant may efficiently cool the LED chip at an area of the illuminant portion thereof, which is located on the side close to the lens 12 and contains a greater amount of heat than the other side of the LED chip.

Since the first coolant is of a transparent material, the illumination light from the LED chip 11 may be allowed to pass through the first coolant to enter the lens 12 without being decreased in luminance.

Since the first coolant has the same refractive index as that of the lens 12 and the package of the LED chip 11, the illumination light from the LED chip 11 is not scattered when passing through the first coolant. Hence, the illumination light may be allowed to enter the lens 12.

Since the piezoelectric device 15 is employed as the pumping device, the first coolant may be brought into the flowing movement under the high output pressure. Furthermore, the first coolant is reciprocally moved so as to accomplish the favorable cooling of the LED chip 11.

While the exemplary embodiment has the arrangement where the light source unit 1 includes a single LED chip 11, the light source unit may have a so-called array configuration wherein a plurality of LED chips 11 are formed.

In this case, the plural LED chips 11 are cooled in common by the first coolant.

Second Exemplary Embodiment of Light Source Unit

Figure 3:
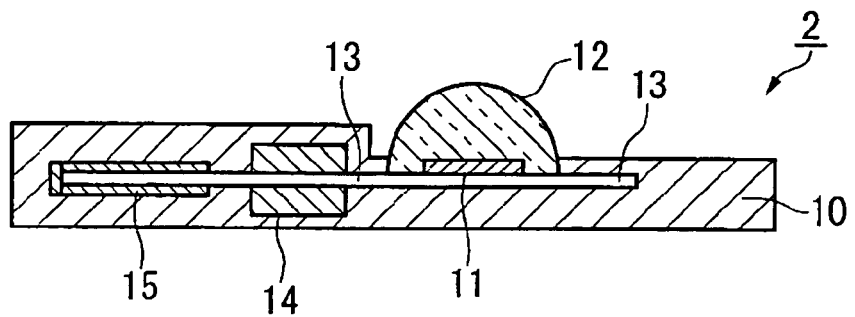
FIG. 3 is a schematic showing a light source unit according to a second exemplary embodiment of the invention.

FIG. 3 is a schematic showing a light source unit according to a second exemplary embodiment of the invention.

In this exemplary embodiment, like components to those of the above first exemplary embodiment are represented by the like reference characters, respectively, for simplicity of the explanation.

Now a description is provided for a difference between this exemplary embodiment and the first exemplary embodiment. While the first exemplary embodiment has the arrangement where the first coolant is caused to flow through space between the LED chip 11 and the lens 12, this exemplary embodiment has an arrangement wherein the first coolant is caused to flow through space under the LED chip 11, as shown in FIG. 3.

That is, a light source unit 2 shown in FIG. 3 permits the coolant to absorb the generated heat directly from a portion of the LED chip 11, at which the coolant does not interfere with the illumination light.

Additionally, the first and second exemplary embodiments may be combined whereby the first coolant may absorb the generated heat of the LED chip 11 from upper and lower sides thereof.

Third Exemplary Embodiment of Light Source Unit

Figure 4:
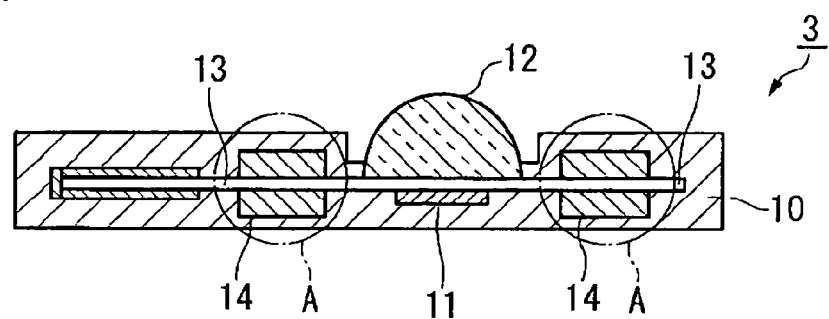
FIG. 4 is a schematic showing a light source unit according to a third exemplary embodiment of the invention.

FIG. 4 is a schematic showing a light source unit according to a third exemplary embodiment of the invention.

In this exemplary embodiment, like components to those of the above first exemplary embodiment are represented by the like reference characters, respectively, for simplicity of the explanation.

Now a description is provided for a difference between this exemplary embodiment and the first exemplary embodiment. While the first exemplary embodiment has the arrangement where the intersection A between the first coolant flow passage 13 and the second coolant flow passage 14 is disposed between the LED chip 11 and the piezoelectric device 15, this exemplary embodiment has an arrangement wherein two intersections A are provided in a manner to sandwich the LED chip 11 therebetween, as shown in FIG. 4.

A light source unit 3 is increased in the area to carry out the heat exchange between the first coolant having absorbed the heat generated from the LED chip 11 and the second coolant and hence, the cooling efficiency may be enhanced even further.

Fourth Exemplary Embodiment of Light Source Unit

Figure 5:
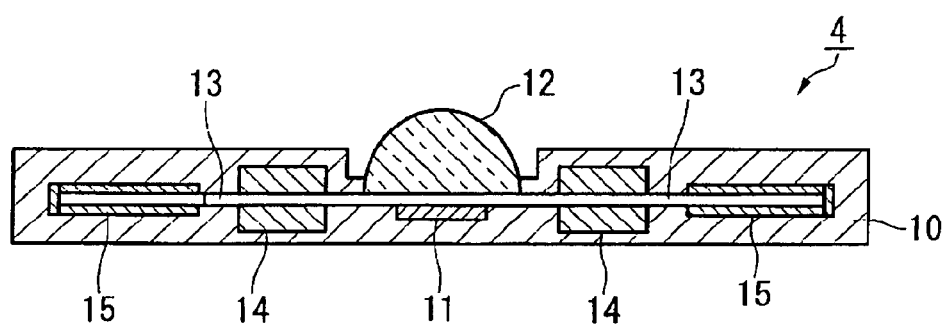
FIG. 5 is a schematic showing a light source unit according to a fourth exemplary embodiment of the invention.

FIG. 5 is a schematic showing a light source unit according to a fourth exemplary embodiment of the invention.

In this exemplary embodiment, like components to those of the above first exemplary embodiment are represented by the like reference characters, respectively, for simplicity of the explanation.

Now a description is provided for a difference between this exemplary embodiment and the first exemplary embodiment. While the first exemplary embodiment includes a single piezoelectric device 15 and a single intersection A, this exemplary embodiment has an arrangement where two piezoelectric devices 15 and two intersections A are provided in a manner to sandwich the LED chip 11 therebetween, as shown in FIG. 5.

A light source unit 4 shown in FIG. 5 not only offers the same working effect as the aforementioned third exemplary embodiment but also achieves a further increased output pressure by virtue of the provision of two piezoelectric devices 15. Even in a case where the first coolant employs a highly viscous fluid, for example, the unit may cause the first coolant to flow through the first coolant flow passage in a favorable manner.

In such an arrangement where two piezoelectric devices 15 are provided, the devices may be driven based on a so-called push-pull drive system. Specifically, the devices may be driven in a manner that while either one of the piezoelectric devices has its drive plate flexed, the drive plate of the other piezoelectric device is in the un-flexed state. This driving system provides the increased output pressure for bringing the first coolant into the flowing movement.

Fifth Exemplary Embodiment of Light Source Unit

Figure 6:
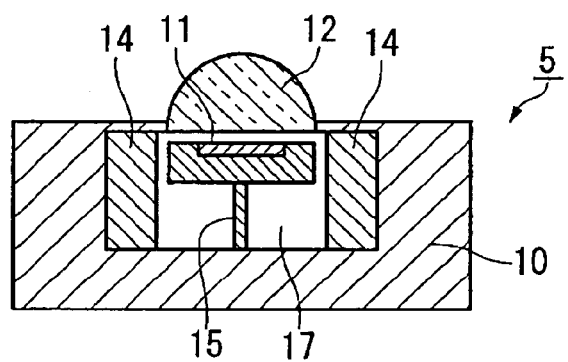
FIG. 6 is a schematic showing a light source unit according to a fifth exemplary embodiment of the invention.

FIG. 6 is a schematic showing a light source unit according to a fifth exemplary embodiment of the invention.

In this exemplary embodiment, like components to those of the above first exemplary embodiment are represented by the like reference characters, respectively, for simplicity of the explanation.

Now a description is provided for a difference between this exemplary embodiment and the first to fourth exemplary embodiments. While the first to the fourth exemplary embodiments are adapted to cool the LED chip 11 by reciprocally moving the first coolant in the first coolant flow passage in the direction in which the mounting substrate 10 is extended, this exemplary embodiment has an arrangement where, as shown in FIG. 6, the LED chip 11 is surrounded by a first coolant 17, the piezoelectric device 15 is disposed below the LED chip 11, and the first coolant 17 is surrounded by the second coolant flow passage 14.

In a light source unit 5 as shown in FIG. 6, the piezoelectric device 15 is so driven as to cause the first coolant 17 to flow around the LED chip 11. Furthermore, the heat contained in the first coolant 17 is absorbed by the second coolant. Thus, the arrangement is made such that the first coolant surrounding the LED chip 11 absorbs the heat generated from the LED chip 11 whereas the second coolant absorbs the heat contained in the first coolant. That is, the overall surface of the LED chip 11 is cooled so that local heating may be reduced or prevented.

Sixth Exemplary Embodiment of Light Source Unit

Figure 7:
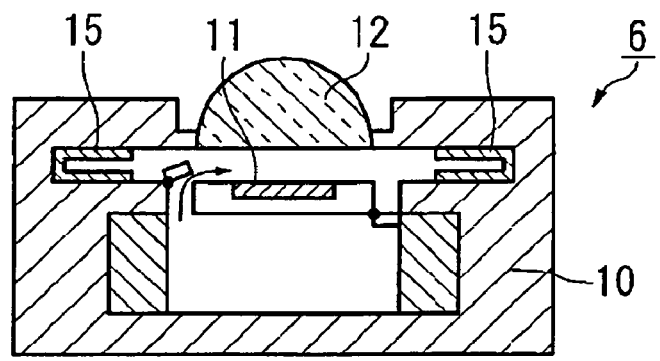
FIG. 7 is a schematic showing a light source unit according to a sixth exemplary embodiment of the invention.
Figure 8:
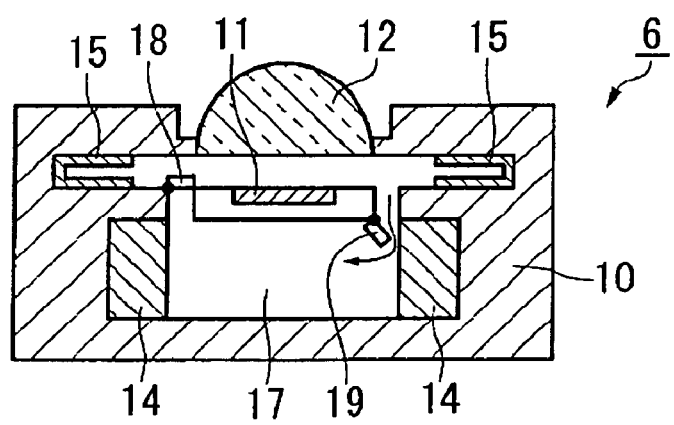
FIG. 8 is a schematic showing a light source unit according to the sixth exemplary embodiment of the invention.

FIGS. 7 and 8 showing a light source unit according to a sixth exemplary embodiment of the invention.

In this exemplary embodiment, like components to those of the above first exemplary embodiment are represented by the like reference characters, respectively, for simplicity of the explanation.

Now a description is provided for a difference between this exemplary embodiment and the first to fourth exemplary embodiments. While the first to the fourth exemplary embodiments are adapted to cool the LED chip 11 by reciprocally moving the coolant in the first coolant flow passage 13 in the direction in which the mounting substrate 10 is extended, this exemplary embodiment has an arrangement wherein the first coolant 17 is circulated around the LED chip 11, as shown in FIGS. 7 and 8.

FIGS. 7 and 8 are schematics for explaining the operations of a light source unit 6. FIG. 7 shows a state where a check valve 18 is opened to supply the first coolant to space above the LED chip 11. FIG. 8 shows a state where a check valve 19 is opened to supply the first coolant to space below the LED chip 11.

The check valves 18, 19 are provided to check the back flow of the first coolant. The provision of the check valves 18, 19 restricts the flowing movement of the first coolant 17 to a predetermined direction, the flowing movement caused by driving the piezoelectric device 15.

According to the light source unit 6 of this exemplary embodiment, the first coolant 17 thus circulated is retained in a constant flowing movement over a heat generating portion of the LED chip 11 so that the heat generated from the LED chip 11 may be constantly transferred to the first coolant 17. This permits the first coolant 17 to maintain a stable cooling power for the LED chip 11.

Seventh Exemplary Embodiment of Light Source Unit

Figure 9:
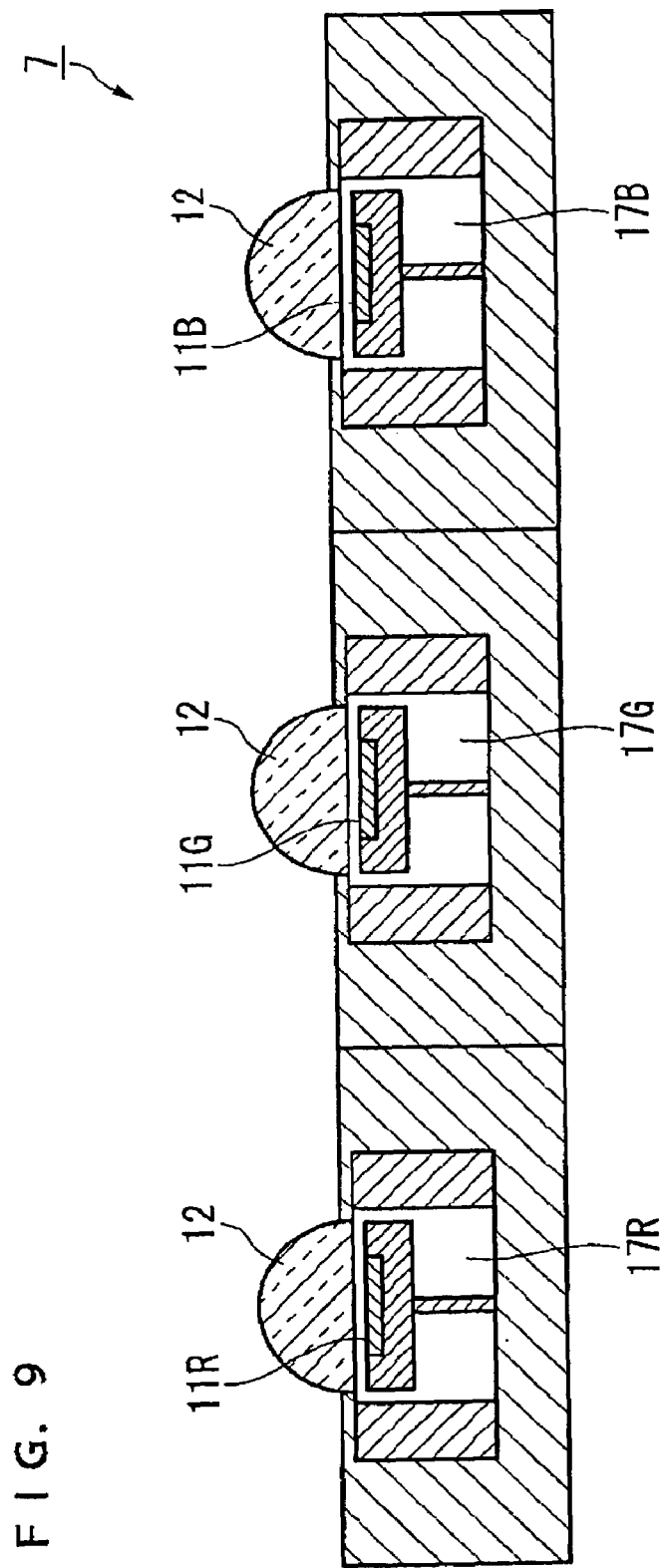
FIG. 9 is a schematic showing a light source unit according to a seventh exemplary embodiment of the invention.

FIG. 9 is a schematic showing a light source unit according to a seventh exemplary embodiment of the invention.

In this exemplary embodiment, like components to those of the above first to sixth exemplary embodiments are represented by the like reference characters, respectively, for simplicity of the explanation.

A light source unit 7 of this exemplary embodiment is characterized in that the type of the first coolant 17 is varied depending upon the color of the illumination light from the LED chip 11.

As shown in FIG. 9, the light source unit 7 includes LED chips 11R, 11G, 11B individually emitting lights of respective colors of RGB; and first coolants 17R, 17G, 17B for absorbing heat generated from the respective LED chips.

The first coolants 17R, 17G, in particular, employ a different material from that of the first coolant 17B.

A fluid material having particular properties dependent upon the color wavelength of light may be selected as the first fluid. For instance, a fluid material more transparent to R or G than B or having a high transmission to a specific color wavelength may be selected as the first fluid, so that the LED chips 11R, 11G, 11B may individually emit light at high luminous efficiencies, without being lowered in illumination performance for the specific color wavelength.

Projector

Figure 10:
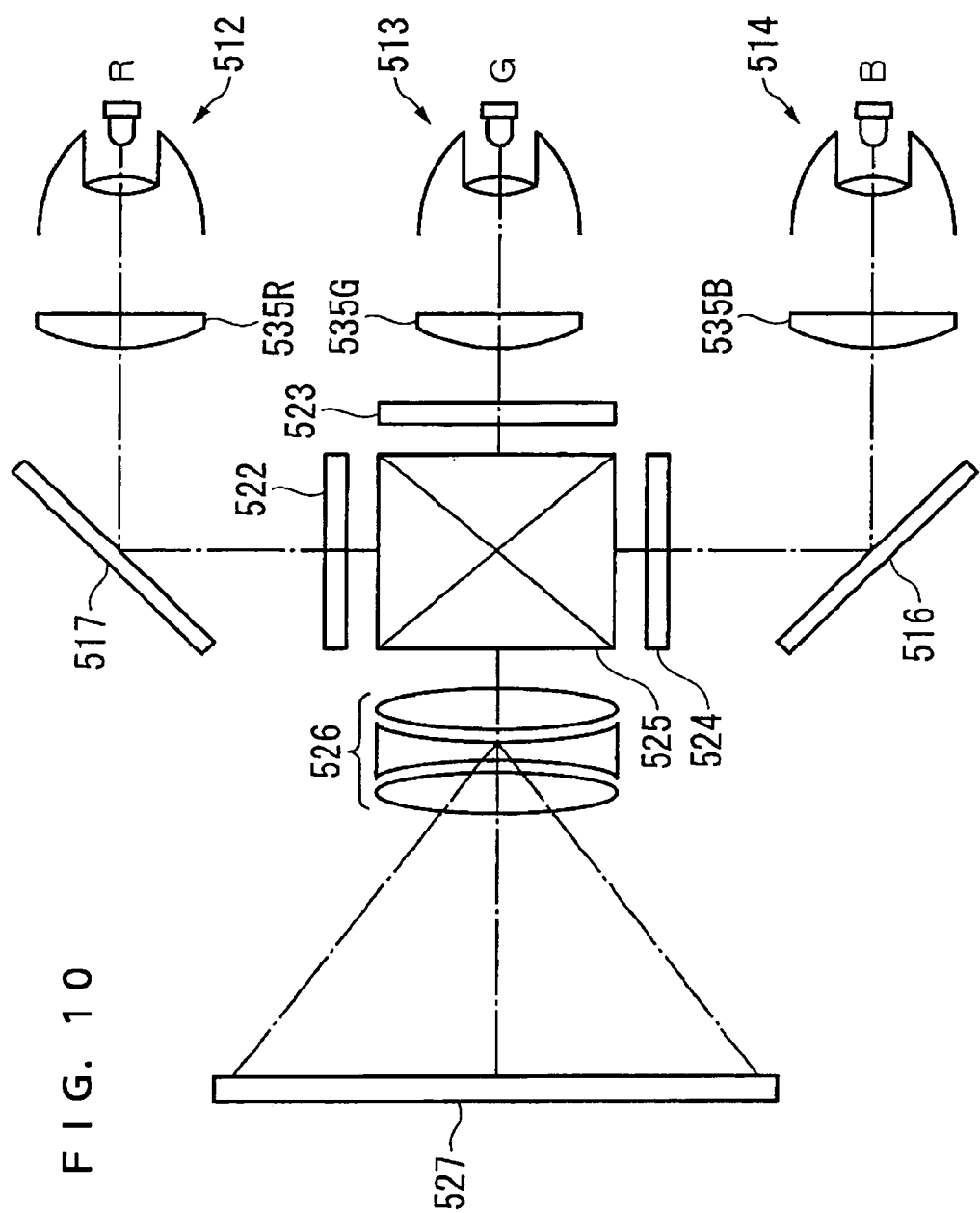
FIG. 10 is a schematic for illustrating a projector including the light source unit of an exemplary aspect of the invention.

FIG. 10 is a schematic a projector equipped with the light source unit according to an exemplary aspect of the invention.

In the figure, the reference characters 512, 513, 514 represent light source units; the reference characters 522, 523, 524 represent liquid-crystal light bulbs (optical modulator device); the reference character 525 represents a cross-dichroic prism (color-light synthesis device); and the reference character 526 represents a projector lens assembly (projector device).

The projector of FIG. 10 includes three light source units 512, 513, 514 each arranged according to an exemplary embodiment of the invention. The light source units 512, 513, 514 employ, as the light sources thereof, LEDs individually emitting lights of red (R), green (G) and blue (B). As a uniform lighting system to uniformalize the illuminance distribution of the source light, a rod lens or fly-eye lens may be disposed rearwardly of each of the light source units.

A light flux from the red light source unit 512 passes through a superimposing lens 535R to be reflected by a reflective mirror 517 and then, becomes incident on the red-light liquid-crystal light bulb 522. A light flux from the green light source unit 513 passes through a superimposing lens 535G to become incident on the green-light liquid-crystal light bulb 523. A light flux from the blue light source unit 512 is reflected by a reflective mirror 516 to pass through a superimposing lens 535B and then, becomes incident on the blue-light liquid-crystal light bulb 522. The light flux from each light source passes through the superimposing lens so as to be superimposed on a display region of the liquid-crystal light bulb. Thus, the liquid-crystal light bulb is uniformly illuminated.

A sheet polarizer (not shown) is provided on an ingress side and an egress side of each liquid-crystal light bulb. Out of the light flux from each light source, only a linear polarized light in a predetermined direction is allowed to pass through the ingress-side sheet polarizer so as to become incident on each liquid-crystal light bulb. Furthermore, polarizer/converter device (not shown) may be provided forwardly of the ingress-side sheet polarizer. In this case, a light flux reflected from the sheet polarizer may be recycled to enter each liquid-crystal light bulb. Accordingly, the projector may be enhance in light utilization factor.

The three color lights modulated by the respective liquid-crystal light bulbs 522, 523, 524 enter the cross-dichroic prism 525. This prism is formed by bonding together four rectangular prisms each having a dielectric laminate film to reflect the red light and a dielectric laminate film to reflect the blue light, which are formed on inside faces thereof. The dielectric laminate films to reflect the red light and the dielectric laminate film to reflect the blue light are formed in a cross shape. These dielectric laminate films synthesize the three color lights to form a light representing a color image. The synthesized light is projected on a projection screen 527 by the projector lens assembly 526 as a projection optical system, whereby an enlarged image is displayed on the screen.

As described above, the projector shown in FIG. 10 is provided with the light source units achieving the increased cooling efficiency. Accordingly, the projector permits the increase of the input power to the solid-state light sources, which, in turn, may provide the increased amount of outgoing light. Thus, the compact light source can emit the illumination light of an extremely high luminance. By virtue of an optimum source etendu, the illumination light thus emitted is effectively captured by the optical modulator device so that the modulated light is projected on the screen to form a bright image.

That is, the compact projector featuring high luminance may be provided.

It is to be noted that the technical scope of the invention is not limited to the forgoing exemplary embodiments but may include various modifications unless such modifications depart from the scope of the invention. In other words, the specific materials and arrangements illustrated by the exemplary embodiments are mere examples thereof and may be changed as required.

What is claimed is:

1. A light source unit, comprising:
   a solid-state light source;
   a lens;
   a first fluid flowing in the vicinity of the solid-state light source thereby absorbing heat generated from the solid-state light source; and
   a second fluid flowing in the vicinity of the first fluid thereby absorbing the heat contained in the first fluid, the second fluid being a liquid.

2. The light source unit as claimed in claim 1, the first fluid flowing through a space between the solid-state light source and the lens.

3. The light source unit as claimed in claim 1, the first fluid flowing on an opposite side of the solid-state light source from a side where the lens is disposed.

4. The light source unit as claimed in claim 1, the first fluid flowing over the peripheries of the solid-state light source.

5. The light source unit as claimed in claim 1, the first fluid comprising:
   a transparent material.

6. The light source unit as claimed in claim 1, the first fluid having the same refractive index as that of the lens.

7. The light source unit as claimed in claim 1, the type of the first fluid being selected according to the wavelength of an illumination light from the solid-state light source.

8. The light source unit as claimed in claim 1, the second fluid flowing around said solid-state light source.

9. The light source unit as claimed in claim 1, further comprising:
a pumping element to bring the first fluid into flowing movement.

10. The light source unit as claimed in claim 9, the pumping element reciprocally moving the first fluid.

11. The light source unit as claimed in claim 9, the pumping element being disposed at opposite ends of a flow passage of the first fluid.

12. The light source unit as claimed in claim 9, the pumping element circulating the first fluid.

13. The light source unit as claimed in claim 9, the pumping element being a piezoelectric device.

14. A projector, comprising:
the light source unit as claimed in claim 1; and
an optical modulator on which light emitted from the light source unit becomes incident.

15. The light source unit as claimed in claim 1, the second fluid being housed in the light source unit.

16. The light source unit as claimed in claim 1, further comprising:
a housing, the first fluid and the second fluid each flowing in the housing.

17. The light source unit as claimed in claim 1, the first fluid flowing in a first direction, and the second fluid flowing in a second direction that intersects the first direction.

18. The light source unit as claimed in claim 1, further comprising:
a substrate;
a first fluid passage; and
a second fluid passage, both of the first fluid passage and the second fluid passage being disposed in the substrate.

19. A light source unit, comprising:
a plurality of solid-state light sources, each of the solid-state light sources emitting light of different color;
a plurality of lenses corresponding to each of the solid-state light sources;
a plurality of first fluids flowing in the vicinity of the solid-state light sources thereby absorbing heat generated from the solid-state light sources, each of the first fluids being varied depending on the color of the illumination light from the solid-state light source and having a high transmission to a specific color wavelength, corresponding to color of the specific solid-state light source, than other color wavelength; and
a second fluid flowing in the vicinity of the first fluids thereby absorbing the heat contained in the first fluids.

20. The projector as claimed in claim 14, the first fluid flowing through a space between the solid-state light source and the lens.

21. The projector as claimed in claim 14, the first fluid flowing on an opposite side of the solid-state light source from a side where the lens is disposed.

22. The projector as claimed in claim 14, the first fluid flowing over the peripheries of the solid-state light source.

23. The projector as claimed in claim 14, the first fluid comprising:
a transparent material.

24. The projector as claimed in claim 14, the first fluid having the same refractive index as that of the lens.

25. The projector as claimed in claim 14, the type of the first fluid being selected according to the wavelength of an illumination light from the solid-state light source.

26. The projector as claimed in claim 14, the second fluid flowing around said solid-state light source.

27. The projector as claimed in claim 14, further comprising:
a pumping element to bring the first fluid into flowing movement.

28. A projector, comprising:
the light source unit as claimed in claim 19; and
an optical modulator on which light emitted from the light source unit becomes incident.

* * * * *